(12) United States Patent
Chen et al.

(10) Patent No.: US 6,187,627 B1
(45) Date of Patent: Feb. 13, 2001

(54) LADING PLUG CONTACT PATTERN FOR DRAM APPLICATION

(75) Inventors: Hsi-Chuan Chen; Sen-Huan Huang, both of Tainan (TW)

(73) Assignee: Winbond Electronics Corporation (TW)

( * ) Notice: Under 35 U.S.C. 154(b), the term of this patent shall be extended for 0 days.

(21) Appl. No.: 09/618,612

(22) Filed: Jul. 18, 2000

(30) Foreign Application Priority Data

Aug. 25, 1999 (TW) .................................. 088114532

(51) Int. Cl.[7] .................................. H01L 21/8242
(52) U.S. Cl. .................................. 438/253; 438/398
(58) Field of Search .................................. 438/238–241, 438/250–256, 381, 393–399

(56) References Cited

U.S. PATENT DOCUMENTS 6,136,645 * 10/2000 Yang et al. .......................... 438/253
6,140,180 * 10/2000 Hong .................................. 438/253

* cited by examiner

*Primary Examiner*—Jey Tsai
(74) *Attorney, Agent, or Firm*—Fish & Richardson P.C.

(57) ABSTRACT

A method of fabricating a semiconductor device having a landing plug is provided. First, a substrate is provided, which has active areas, wordlines stretching over the active areas and an isolation layer filling the gaps between the wordlines. Second, a pattern is defined and the isolation layer masked with the pattern is etched for the formation of bitline and node contacts, wherein the pattern has a protrusion which shortens the length of the bitline to wordline overlap formed thereby. Finally, the contacts are filled with a conducting layer.

16 Claims, 7 Drawing Sheets

LADING PLUG CONTACT PATTERN FOR DRAM APPLICATION

BACKGROUND OF THE INVENTION

1. Field of the Invention

The present invention relates in general to the fabrication of semiconductor devices, and more particularly to a method for forming a landing plug contact in a memory device.

2. Description of the Related Arts

In DRAM fabrication, even though the DRAM technology is progressing, a simple rectangular pattern shown in FIG. 1A is being widely used for the active area formed by Shallow Trench Isolation (STI). However, there is a bitline and node contact (CB and CN) landing problem when using the simple rectangular active area pattern in the capacitor over bitline (COB) structure. An extended landing pad method and twisted bitline technology has been proposed to address the above problem, but they suffer from other problems. In the extended landing pad method, there is a photolithography limitation due to the close packed unsymmetrical contact pattern and small contact dimensions.

In the twisted bitline technology, the increased bitline-to-bitline coupling capacitance results in degradation of the retention time.

Recently, a method using an island-shaped mask pattern assisted by CMP is provided in "A Fully Printable, Self-aligned and Planarized Stacked Capacitor DRAM Cell Technology for 1 Gbit DRAM and Beyond", Y.Kohyama et al., Symposium on VLSI Technology Digest of Technical Papers, p. 17, 1997. It is explained in detail.

FIGS. 1~4 are views illustrating the steps of the method. FIGS. 1B~4B and FIGS. 1C~4C are the cross-sectional views derived by cutting FIGS. 1A~4A along the lines AA' and BB', respectively.

Referring to FIGS. 1A, 1B and 1C, a substrate 10 is provided, and active areas 12 and an isolation area 14 are formed thereon by STI with the simple rectangular active area pattern.

Referring to FIGS. 2A, 2B and 2C, by ion implantation, doped regions 16 are formed for the source and drain regions of the devices. Then, a gate oxide 18, a polysilicon layer 20, a metallic layer 22 and a nitride layer 24 are deposited sequentially. The gate oxide 18, polysilicon layer 20 and metallic layer 22 are 20 Å~50 Å, 500 Å~1500 Å and 500 Å~1500 Å in thickness, respectively. The metallic layer 22 used as wordline is composed of W or $WSi_2$, the nitride layer 24 used as isolation layer is composed of SiN, and the polysilicon layer 20 is used as gate. Afterward, strip-shaped stacked layers 25 composed of gate 20 (the polysilicon layer), wordline 22 (the metallic layer) and isolation layer 24 (the nitride layer) are formed by conventional photolithography and etching. Thus, stacked layers 25 stretch over the active areas 12. Then, a covering isolation film 26 composed of SiN and an isolation layer 28 composed of BPSG are deposited. The isolation layer 28 is ground by CMP so that the isolation layer 28 and the stacked layers 25 have a joint plane surface.

In FIGS. 3A, 3B and 3C, the isolation layer 28 is etched with island-shaped rectangular patterns 30. The island-shaped rectangular patterns 30 stretch over the stacked layers 25 and mask the isolation layer 28 therebeneath during etching. Consequently, bitline contacts 32A and node contacts 32B are formed by self alignment contact etch technology and the bitline contacts 32A are longer than the node contacts 32B in length.

In FIGS. 4A, 4B and 4C, a conducting layer 34 composed of W or polysilicon is deposited and ground by CMP so that the conducting layer 34 and the stacked layers 25 have a joint plane surface.

The above method eliminates the problems in the extended landing pad method and twisted bitline technology, but results in a large leakage current and bitline-to-wordline coupling capacitance due to the long bitline contacts.

SUMMARY OF THE INVENTION

It is therefore an object of the invention to provide a method for forming reduced coupling capacitance bitline contacts in a memory device.

To accomplish the above objective, the present invention provides a method of fabricating a semiconductor device having a landing plug. First, a substrate is provided, which has active areas, wordlines stretching over the active areas and an isolation layer filling the gaps between the worlines. Second, a pattern is defined and the isolation layer masked with the pattern is etched for the formation of bitline and node contacts, wherein the pattern has a protrusion which shortens the length of the bitline contacts formed thereby. Finally, all the contacts are filled with a conducting layer.

Wherein, the pattern is a T-shaped island pattern or a cross-shaped island pattern.

The bitline contacts formed by the method provided in the invention are shorter than those formed by the above-mentioned prior art. Therefore, a large leakage current and a large bitline-to-wordline coupling capacitance no longer exist.

Other objects, features, and advantages of the present invention will become apparent from the following detailed description which makes reference to the accompanying drawings. dr

DESCRIPTION OF THE DRAWINGS

FIGS. 1A through 4A are plan views illustrating the steps of a conventional method for fabricating a semiconductor memory device;

FIGS. 1B through 4B are cross-sectional views illustrating the steps of a conventional method for fabricating a semiconductor memory device;

FIGS. 1C through 4C are cross-sectional views illustrating the steps of a conventional method for fabricating a semiconductor memory device;

DESCRIPTION OF THE PREFERRED EMBODIMENTS

Now in keeping with the objective of this invention, the method for fabricating a semiconductor device is described in detail.

The steps before the formation of contacts are the same as those of the method provided in the prior art. FIGS. 5B, 6B and FIGS. 5C, 6C are the cross-sectional views derived by cutting FIG. 5A and 6A along the lines AA' and BB', respectively.

Figure 1A:
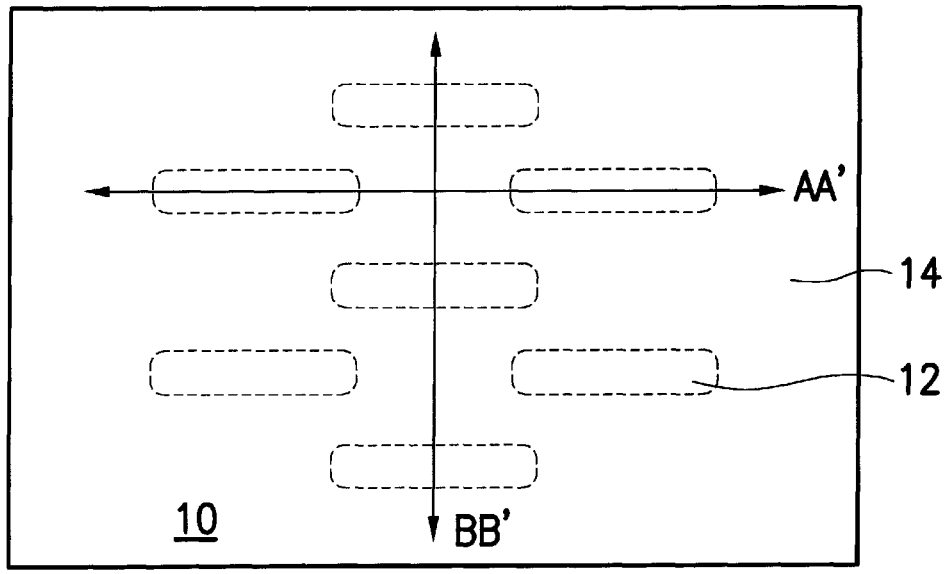
Figure 1B:
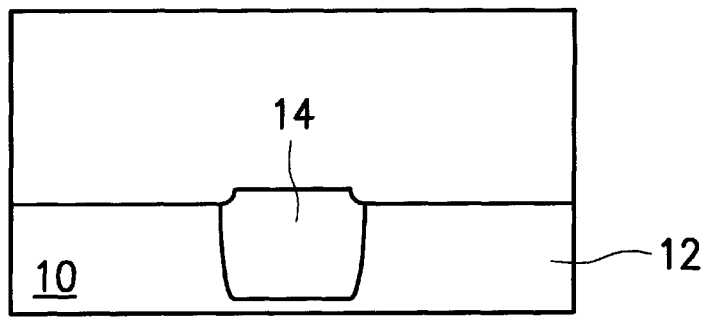
Figure 1C:
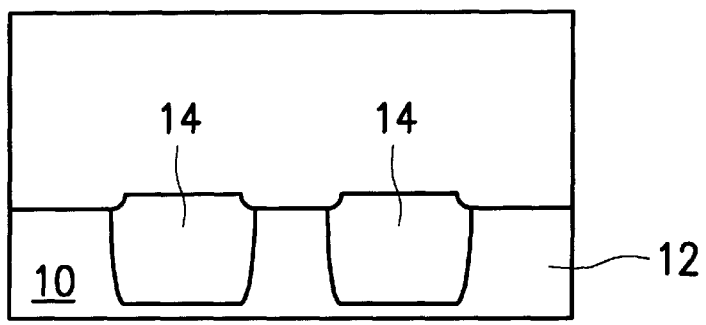

Referring to FIGS. 1A, 1B and 1C, a substrate 10 is provided, and active areas 12 and an isolation area 14 are formed thereon by STI with the simple rectangular active area pattern.

Figure 2A:
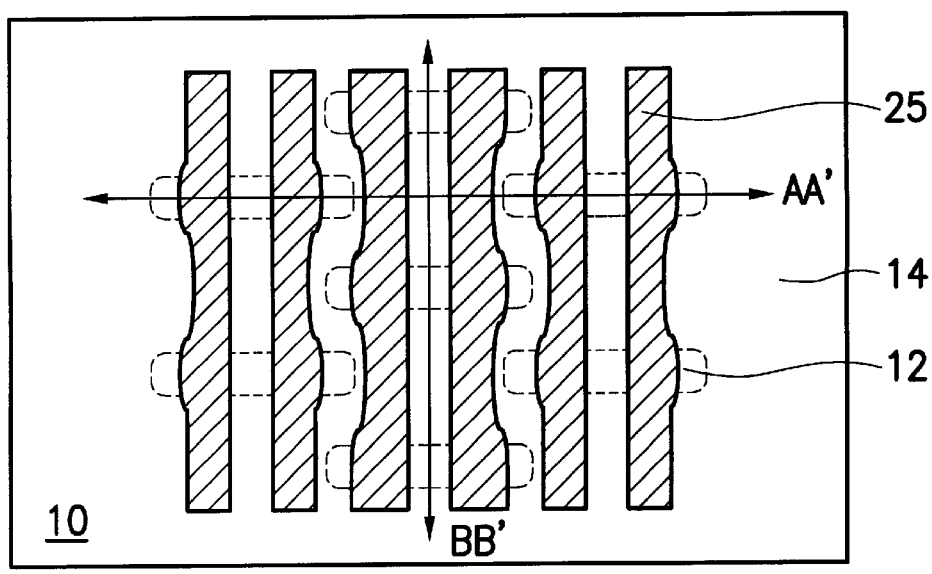
Figure 2B:
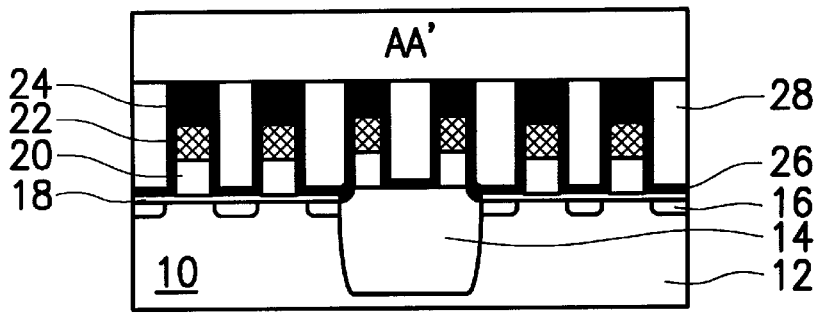
Figure 2C:
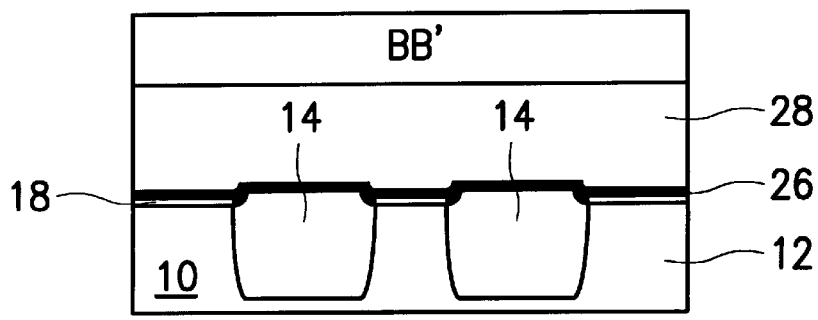
Figure 3A:
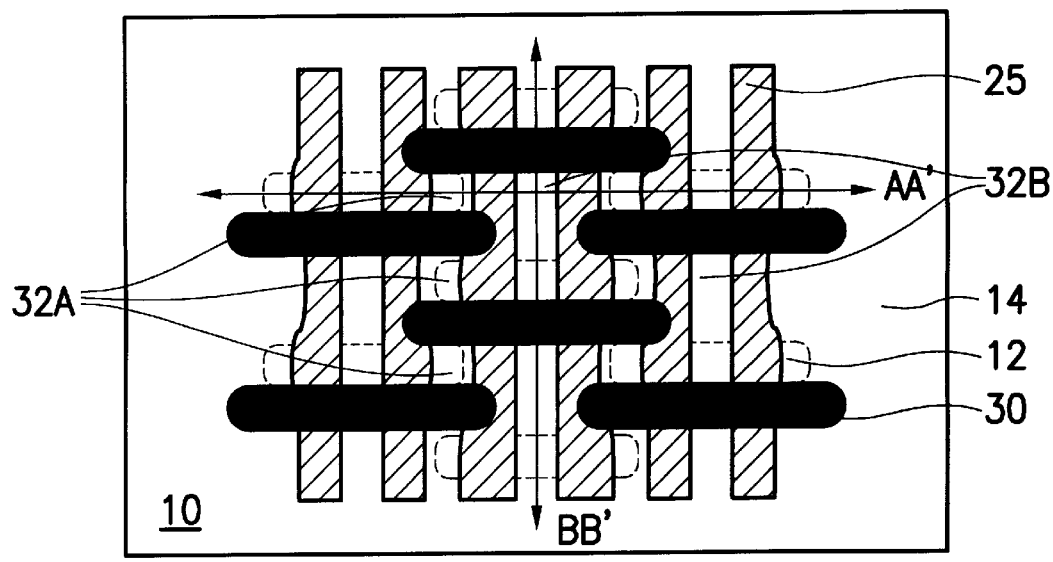
Figure 3B:
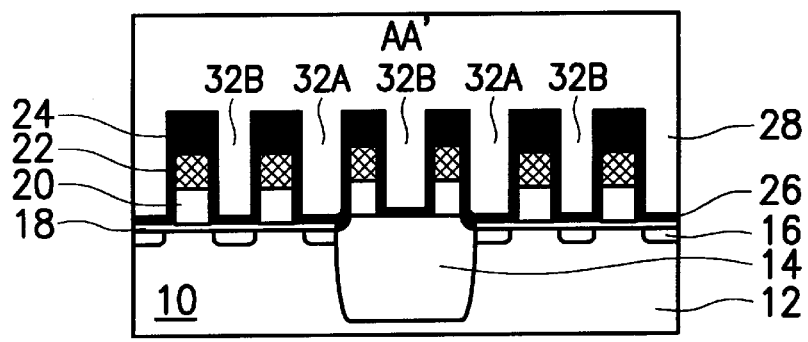
Figure 3C:
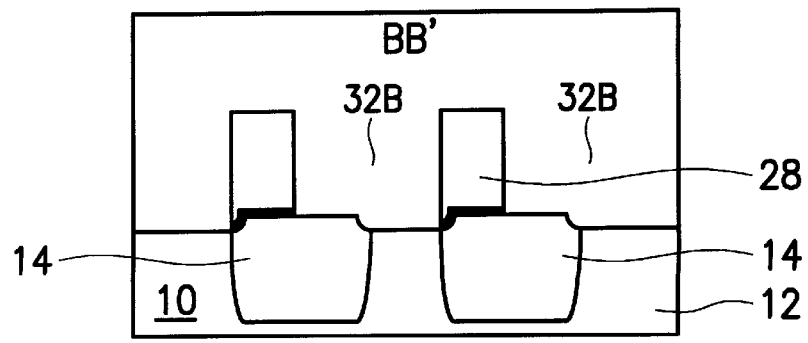
Figure 4A:
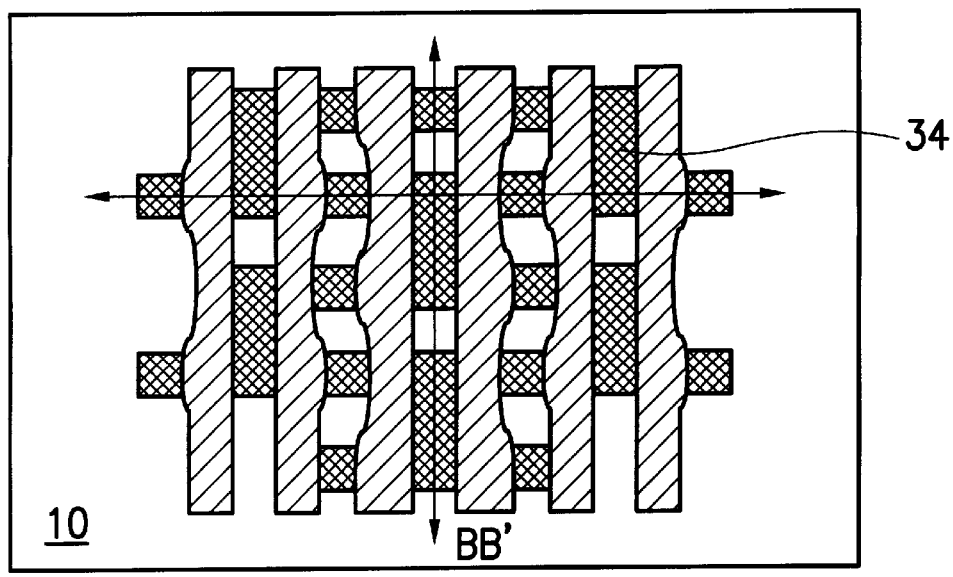
Figure 4B:
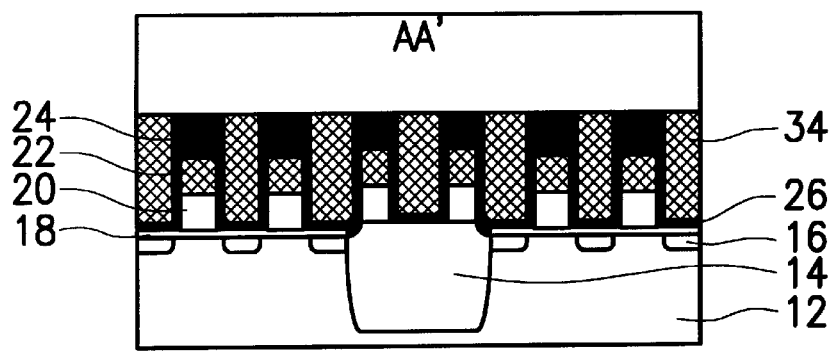
Figure 4C:
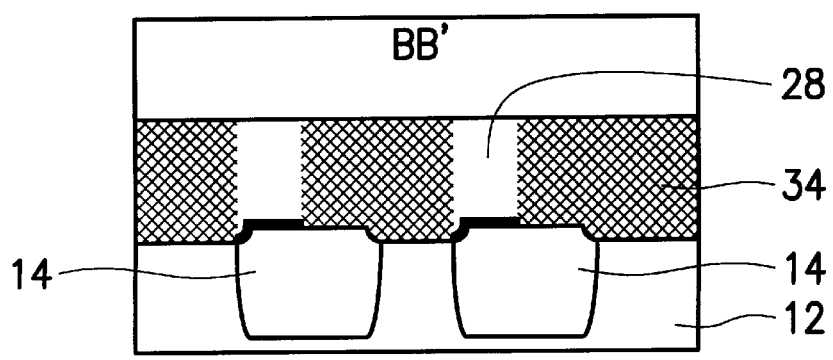

Referring to FIGS. 2A, 2B and 2C, by ion implantation, doped regions 16 are formed for the source and drain regions of the devices. Then, a gate oxide 18, a polysilicon layer 20, a metallic layer 22 and a nitride layer 24 are deposited sequentially. The gate oxide 18, polysilicon layer 20 and metallic layer 22 are 20 Å~50 Å, 500 Å~1500 Å and 500 Å~1500 Å in thickness, respectively. The metallic layer 22 used as wordline is composed of W or $WSi_2$, the nitride layer 24 used as isolation layer is composed of SiN, and the polysilicon layer 20 is used as gate. Afterward, strip-shaped stacked layers 25 composed of gate 20 (the polysilicon layer), wordline 22 (the metallic layer) and isolation layer 24 (the nitride layer) are formed by conventional photolithography and etching. Thus, stacked layers 25 stretch over the active areas 12. Then, a covering isolation film 26 composed of SiN and an isolation layer 28 composed of BPSG are deposited. The isolation layer 28 is ground by CMP so that the isolation layer 28 and the stacked layers 25 have a joint plane surface.

Figure 5A:
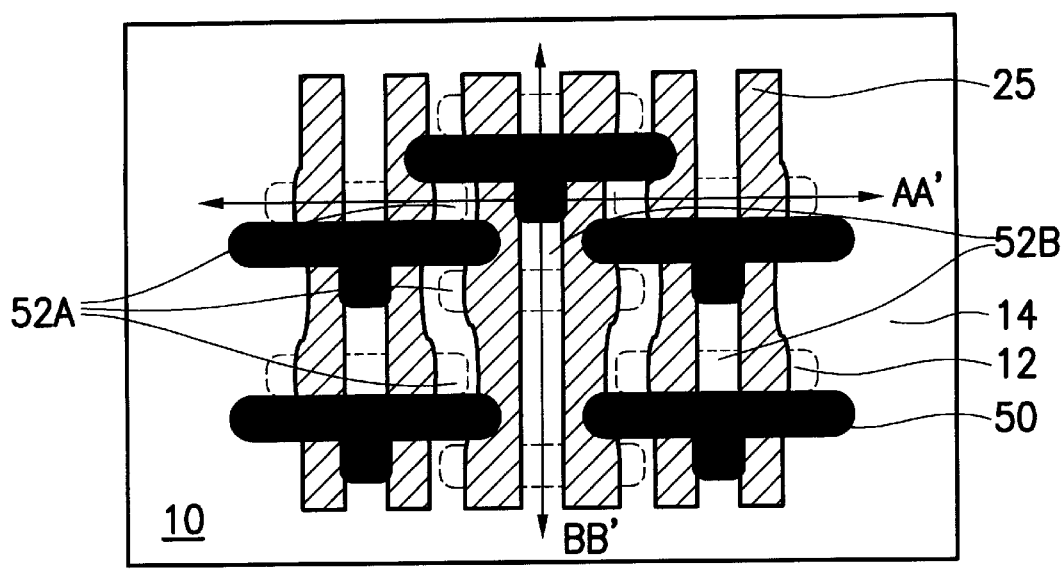
FIGS. 5A and 6A are plan views illustrating the steps of the method for fabricating a semiconductor memory device according to the invention.
Figure 5B:
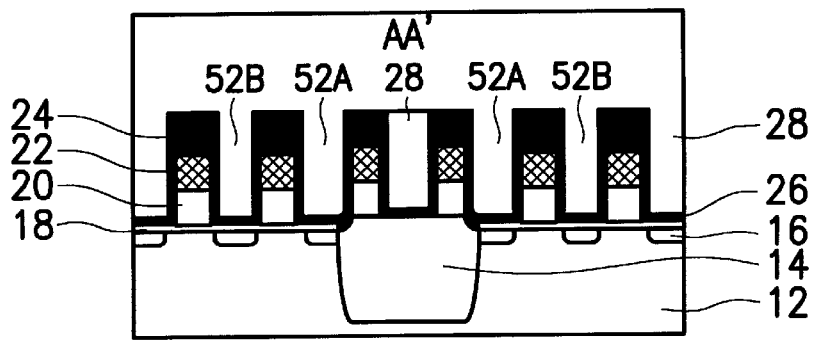
FIGS. 5B and 6B are cross-sectional views illustrating the steps of the method for fabricating a semiconductor memory device according to the invention.
Figure 5C:
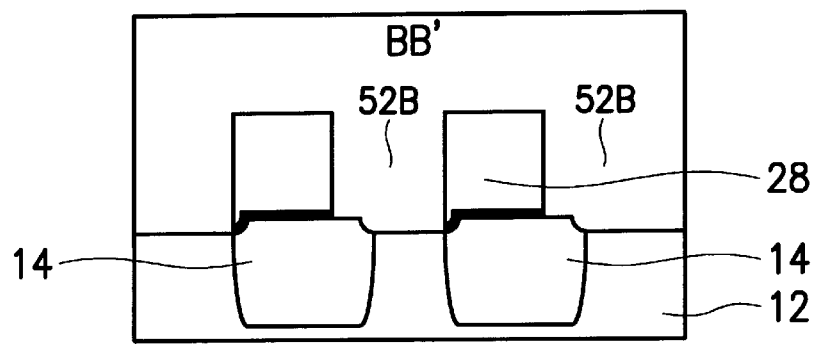
FIGS. 5C and 6C are cross-sectional views illustrating the steps of the method for fabricating a semiconductor memory device according to the invention.

Referring to FIGS. 5A, 5B and 5C, the isolation layer 28 is etched with T-shaped island patterns 50. The T-shaped island patterns 50 stretch over the stacked layers 25 and mask the isolation layer 28 therebeneath during etching. Consequently, bitline contacts 52A and node contacts 52B are formed.

Figure 6A:
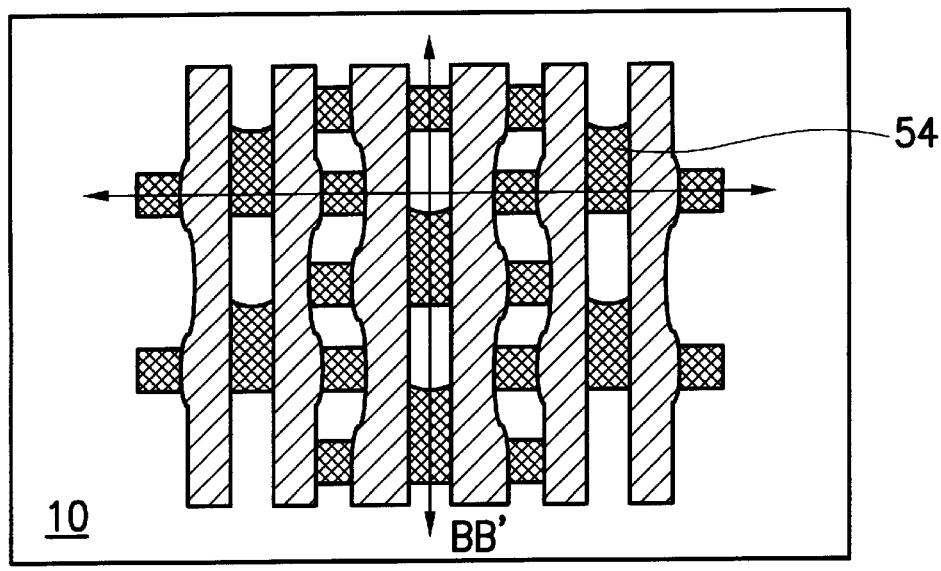
Figure 6B:
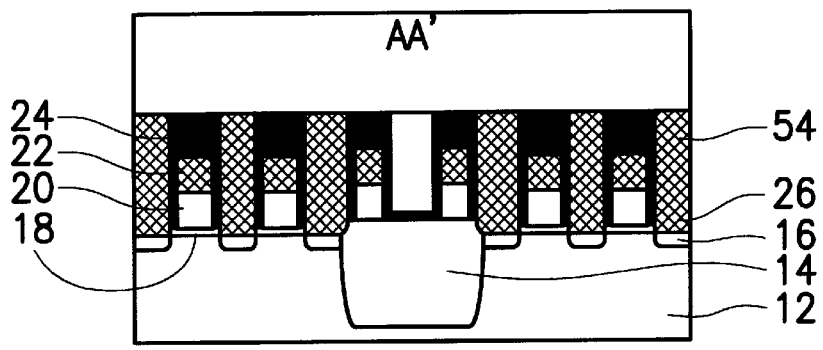
Figure 6C:
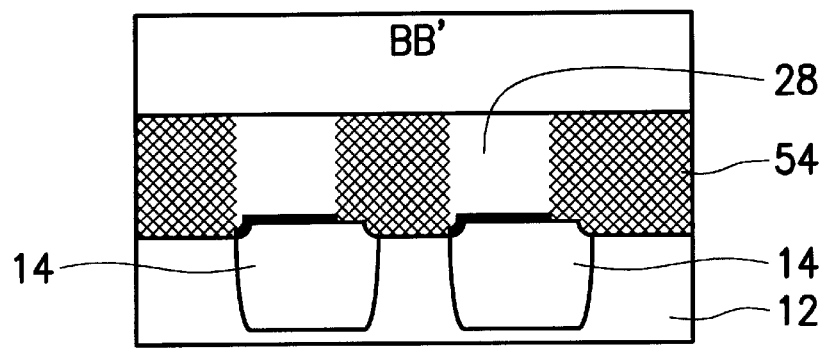

Referring to FIGS. 6A, 6B and 6C, a conducting layer 54 composed of W or polysilicon is deposited and ground by CMP so that the conducting layer 54 and the stacked layers 25 have a joint plane surface.

The main distinction between the methods provided in the invention and the prior art is the shape of the pattern used. Each of the T-shaped island patterns 50 has an additional protrusion and masks more area of isolation layer 28 therebeneath. Thus, bitline contacts 52A are shorter than the bitline contacts 32A formed by the prior art.

Figure 7:
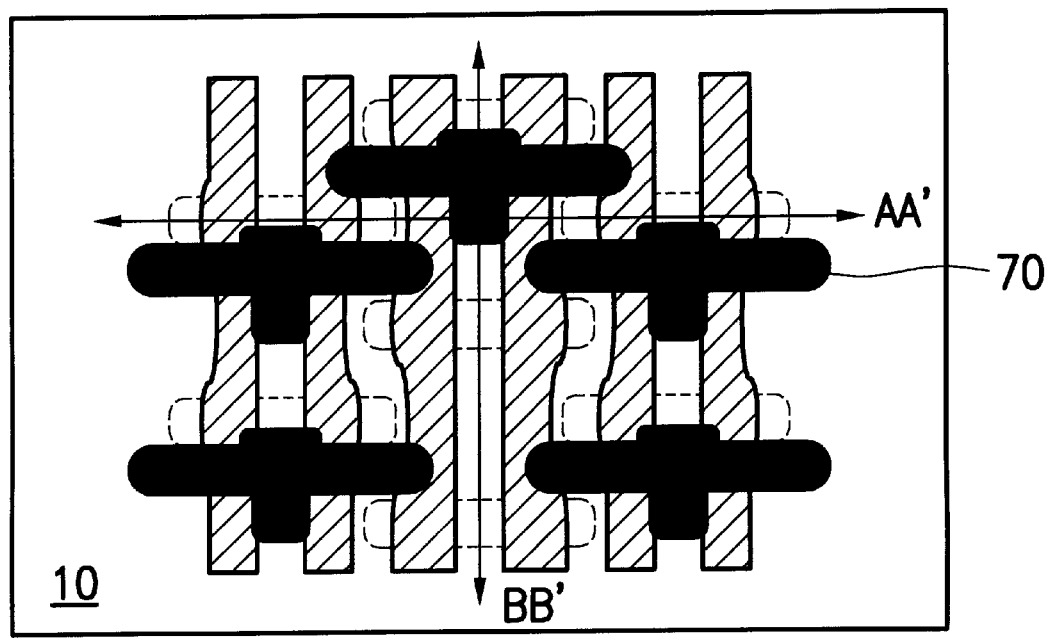
FIG. 7 is a plan view illustrating cross-shaped island patterns.

In addition, referring to FIG. 7, cross-shaped island patterns 70 are used for the formation of the contacts. Each of the cross-shaped island patterns 70 has two additional protrusions toward opposite directions. Thus, bitline contacts are even shorter than those formed with the T-shaped island patterns 50. The leakage current and bitline-to-wordline coupling capacitance can be further reduced.

While the invention has been particularly shown and described with the reference to the preferred embodiment thereof, it will be understood by those skilled in the art that various changes in form and details may be made without departing from the spirit and scope of the invention.

What is claimed is:

1. A method of fabricating a semiconductor device having a landing plug, comprising the steps of:

providing a substrate having active areas, wordlines stretching over the active areas and an isolation layer filling the gaps between the worlines;

defining a pattern, masking and etching the isolation layer with the pattern for the formation of bitline and node contacts, wherein the pattern has a protrusion which shortens the length of the bitlines formed thereby; and filling the contacts with a conducting layer.

2. The method as claimed in claim 1, wherein the active areas are rectangular island-shaped.

3. The method as claimed in claim 1, wherein the isolation layer is formed of BPSG.

4. The method as claimed in claim 1, wherein the conducting layer is formed of polysilicon.

5. The method as claimed in claim 1, wherein the conducting layer is formed of tungsten.

6. The method as claimed in claim 1, wherein the pattern is a T-shaped island pattern.

7. The method as claimed in claim 1, wherein the pattern is a cross-shaped island pattern.

8. A method of fabricating a semiconductor device having a landing plug, comprising the steps of:

providing a substrate and forming active areas thereon;

performing ion implantation to form source and drain regions in the active areas on the substrate;

depositing a gate oxide, a polysilicon layer, a metallic layer and a nitride layer sequentially;

defining regions for wordlines, and etching through the nitride, metallic and polysilicon layer outside the regions;

depositing an covering isolation film and filling the gaps between the wordlines with an isolation layer;

defining a pattern, masking and etching the isolation layer with the pattern for the formation of bitline and node contacts, wherein the pattern has a protrusion which shortens the length of the bitlines formed thereby; and filling the contacts with a conducting layer.

9. The method as claimed in claim 8, wherein the active areas are rectangular island-shaped.

10. The method as claimed in claim 8, wherein the active areas are formed with a simple rectangular pattern by Shallow Trench Isolation method.

11. The method as claimed in claim 8, wherein the covering isolation film is formed of silicon nitride.

12. The method as claimed in claim 8, wherein the isolation layer is formed of BPSG.

13. The method as claimed in claim 8, wherein the conducting layer is formed of polysilicon.

14. The method as claimed in claim 8, wherein the conducting layer is formed of tungsten.

15. The method as claimed in claim 8, wherein the pattern is a T-shaped island pattern.

16. The method as claimed in claim 8, wherein the pattern is a cross-shaped island pattern.

* * * * *